(12) United States Patent
Kim

(10) Patent No.: US 11,031,064 B1
(45) Date of Patent: Jun. 8, 2021

(54) SEMICONDUCTOR DEVICES

(71) Applicant: SK hynix Inc., Icheon-si (KR)

(72) Inventor: Chang Hyun Kim, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/906,568

(22) Filed: Jun. 19, 2020

(30) Foreign Application Priority Data

Dec. 19, 2019 (KR) ........................ 10-2019-0171269

(51) Int. Cl.
*G11C 11/406* (2006.01)
*G11C 11/4072* (2006.01)
*G11C 11/408* (2006.01)
*G11C 11/4096* (2006.01)

(52) U.S. Cl.
CPC .... *G11C 11/40615* (2013.01); *G11C 11/4072* (2013.01); *G11C 11/4082* (2013.01); *G11C 11/4087* (2013.01); *G11C 11/4096* (2013.01); *G11C 2211/4062* (2013.01)

(58) Field of Classification Search
None
See application file for complete search history.

(56) References Cited

U.S. PATENT DOCUMENTS

2013/0028034 A1* 1/2013 Fujisawa ............ G11C 11/4093
365/194

FOREIGN PATENT DOCUMENTS

KR    1020140126225 A    10/2014
KR       101883652 B1    8/2018

* cited by examiner

*Primary Examiner* — James G Norman
(74) *Attorney, Agent, or Firm* — William Park & Associates Ltd.

(57) ABSTRACT

A semiconductor device includes a buffer control circuit and an operation control circuit. The buffer control circuit generates an enable signal based on a self-refresh signal and to generate an end control signal and a supply control signal from a first internal chip selection signal during a self-refresh operation. The operation control circuit generates a frequency information signal from an internal command/address signal when an update signal is inputted during a mode register write operation, adjusts a shift amount based on the frequency information signal when the supply control signal is inputted during the mode register write operation, and generates an internal write command according to the adjusted shift amount during a read-modify-write operation in synchronization with an internal clock signal after generating an internal read command.

25 Claims, 15 Drawing Sheets

FIG. 3

| FREQUENCY | FQ_INF<1> | FQ_INF<2> | FQ_INF<3> | FREQUENCY PERIOD |
|---|---|---|---|---|
| LOW | H | L | L | 2000Mbps~4000Mbps |
| MIDDLE | L | H | L | 4000Mbps~5200Mbps |
| HIGH | L | L | H | 5200Mbps~6400Mbps |

SEMICONDUCTOR DEVICES

CROSS-REFERENCE TO RELATED APPLICATIONS

The present application claims priority under 35 U.S.C. 119(a) to Korean Patent Application No. 10-2019-0171269, filed on Dec. 19, 2019, which is incorporated herein by reference in its entirety.

BACKGROUND

1. Technical Field

Embodiments of the present disclosure relate to semiconductor devices performing a read-modify-write operation by executing a frequency adjustment operation during a self-refresh operation.

2. Related Art

Recently, various design schemes receiving and outputting multi-bit data during each clock cycle have been used to improve an operation speed of semiconductor devices. A typical design scheme for improving an operation speed of semiconductor devices is to increase a frequency of a clock signal in order to receive and output multi-bit data at a high speed. If a data transmission speed of the semiconductor devices becomes faster, the probability of occurring errors may increase while the data are transmitted in the semiconductor devices. Accordingly, advanced design schemes have been proposed to guarantee the reliability of the data transmission.

Whenever the data are transmitted in semiconductor devices, error codes such as an error detection code (EDC) and an error correction code (ECC) which are capable of detecting the occurrence of errors may be generated and transmitted with the data to guarantee the reliability of data transmission.

Meanwhile, the semiconductor devices may provide a read-modify-write operation which is capable of supplementing insufficient bits of data by internally executing a read operation when the number of bits of data written to use the error code is insufficient.

SUMMARY

According to an embodiment, a semiconductor device includes a buffer control circuit and an operation control circuit. The buffer control circuit is configured to generate an enable signal based on a self-refresh signal and configured to generate an end control signal and a supply control signal from a first internal chip selection signal during a self-refresh operation. The operation control circuit is configured to generate a frequency information signal from an internal command/address signal when an update signal is inputted during a mode register write operation, configured to adjust a shift amount based on the frequency information signal when the supply control signal is inputted during the mode register write operation, and configured to generate an internal write command according to the adjusted shift amount during a read-modify-write operation in synchronization with an internal clock signal after generating an internal read command.

According to another embodiment, a semiconductor device includes an operation control circuit, a core circuit, and an error correction code (ECC) circuit. The operation control circuit is configured to generate a frequency information signal for adjusting a shift amount from an internal command/address signal based on an update signal during a mode register write operation, configured to adjust the shift amount based on the frequency information signal, and configured to generate an internal write command in synchronization with an internal clock signal according to the adjusted shift amount during a read-modify-write operation after generating an internal read command. The core circuit is configured to output read data stored therein based on the internal read command and configured to store write data based on the internal write command. The ECC circuit is configured to generate the write data from the read data and transmission data during the read-modify-write operation.

BRIEF DESCRIPTION OF THE DRAWINGS

FIG. 3 is a table illustrating logic levels of a frequency information signal for performing a frequency adjustment operation during a self-refresh operation of a semiconductor device according to an embodiment of the present disclosure.

DETAILED DESCRIPTION OF THE EMBODIMENTS

In the following description of the embodiments, when a parameter is referred to as being "predetermined," it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first," "second," "third," etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage correspond to a signal having a logic "high" level, a signal having a second voltage correspond to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment.

Various embodiments of the present disclosure will be described hereinafter in detail with reference to the accompanying drawings. However, the embodiments described herein are for illustrative purposes only and are not intended to limit the scope of the present disclosure.

Figure 1:
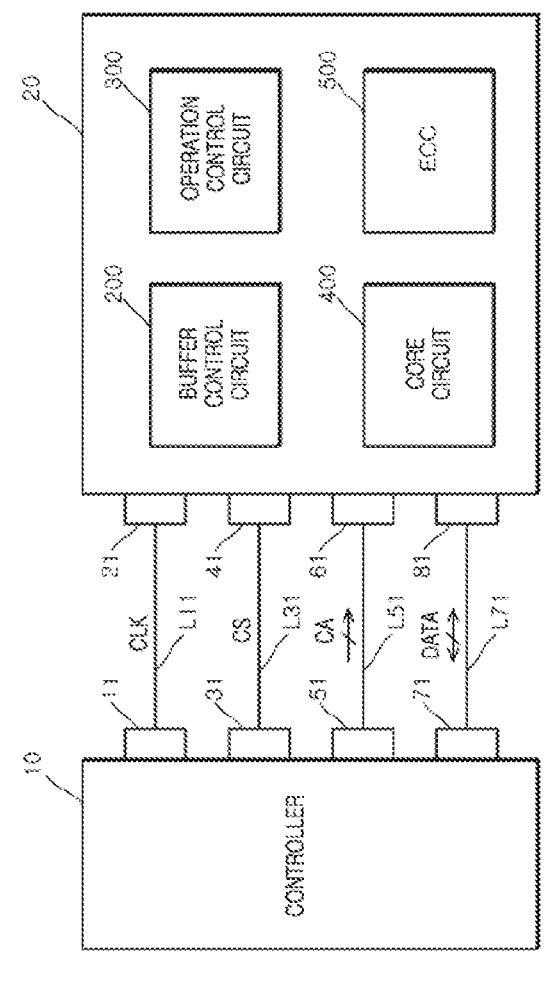
FIG. 1 is a block diagram illustrating a configuration of a semiconductor system according to an embodiment of the present disclosure.

FIG. 1 is a block diagram illustrating a configuration of a semiconductor system 1 according to an embodiment of the present disclosure. As illustrated in FIG. 1, the semiconductor system 1 may include a controller 10 and a semiconductor device 20. The semiconductor device 20 may include a buffer control circuit 200, an operation control circuit 300, a core circuit 400, and an error correction code (ECC) circuit 500.

The controller 10 may include a first control pin 11, a second control pin 31, a third control pin 51, and a fourth control pin 71. The semiconductor device 20 may include a first semiconductor pin 21, a second semiconductor pin 41, a third semiconductor pin 61, and a fourth semiconductor pin 81. The first control pin 11 and the first semiconductor pin 21 may be connected to each other by a first transmission line L11. The second control pin 31 and the second semiconductor pin 41 may be connected to each other by a second transmission line L31. The third control pin 51 and the third semiconductor pin 61 may be connected to each other by a third transmission line L51. The fourth control pin 71 and the fourth semiconductor pin 81 may be connected to each other by a fourth transmission line L71. The controller 10 may transmit a clock signal CLK to the semiconductor device 20 through the first transmission line L11 to control the semiconductor device 20. The controller 10 may transmit a chip selection signal CS to the semiconductor device 20 through the second transmission line L31 to control the semiconductor device 20. The controller 10 may transmit a command/address signal CA to the semiconductor device 20 through the third transmission line L51 to control the semiconductor device 20. The controller 10 may receive data DATA from the semiconductor device 20 or may transmit the data DATA to the semiconductor device 20, through the fourth transmission line L71.

The buffer control circuit 200 may generate an enable signal EN for activating any one of a first buffer (110 of FIG. 2) and a second buffer (120 of FIG. 2) during a self-refresh operation. The buffer control circuit 200 may generate an end control signal (SRX of FIG. 2) and a supply control signal (SR_APY of FIG. 2) from a first internal chip selection signal (ICS<1> of FIG. 2) inputted through the first buffer (110 of FIG. 2).

Figure 2:
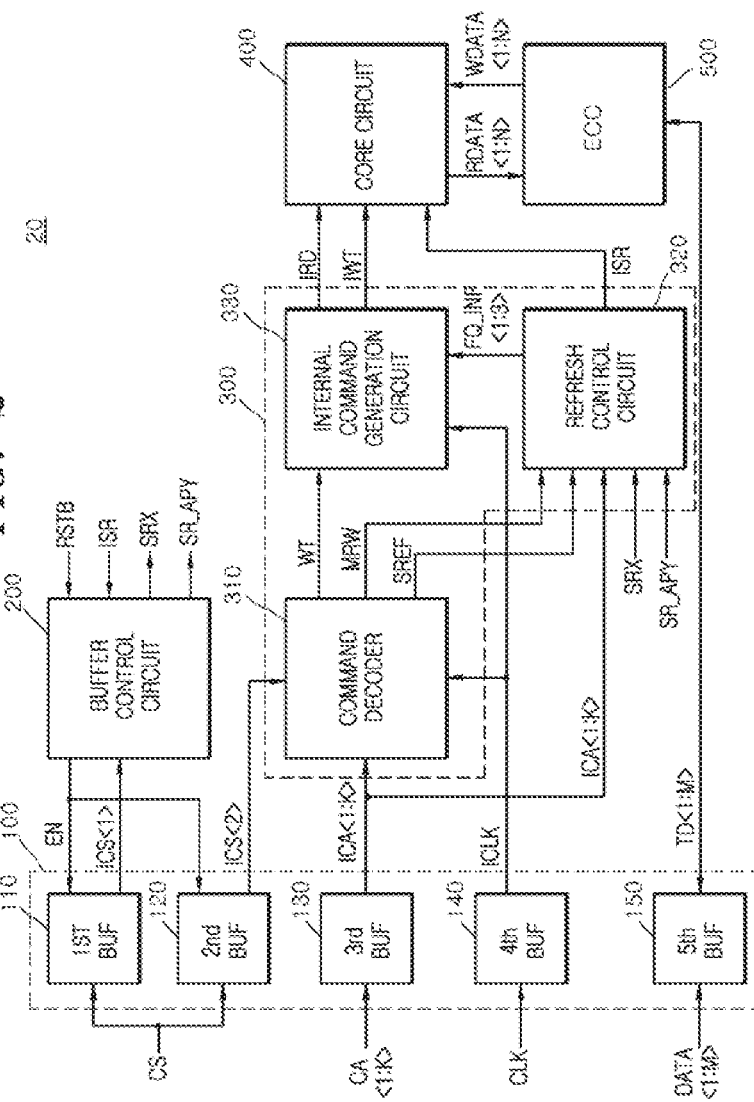
FIG. 2 is a block diagram illustrating a configuration of a semiconductor device included in the semiconductor system illustrated in FIG. 1.

When an update signal (ICA<K> of FIG. 2) is inputted to the operation control circuit 300 during a mode register write operation, the operation control circuit 300 may generate first to third frequency information signals (FQ_INF<1:3> of FIG. 2) from first to $K^{th}$ internal command/address signals (ICA<1:K> of FIG. 2). When the supply control signal (SR_APY of FIG. 2) is inputted to the operation control circuit 300, the operation control circuit 300 may adjust a shift amount based on the first to third frequency information signals (FQ_INF<1:3> of FIG. 2). The operation control circuit 300 may be synchronized with an internal clock signal ICLK to generate an internal write command (IWT of FIG. 2) using the shift amount adjusted during the read-modify-write operation after an internal read command (IRD of FIG. 2) is generated.

The core circuit 400 may output first to $N^{th}$ read data (RDATA<1:N> of FIG. 2) stored in the core circuit 400 based on the internal read command (IRD of FIG. 2). The core circuit 400 may store first to $N^{th}$ write data (WDATA<1:N> of FIG. 2) based on the internal write command (IWT of FIG. 2). The core circuit 400 may perform a self-refresh operation based on a self-refresh signal (ISR of FIG. 2).

The ECC circuit 500 may generate the first to $N^{th}$ write data (WDATA<1:N> of FIG. 2) from the first to $N^{th}$ read data (RDATA<1:N> of FIG. 2) and the first to $M^{th}$ transmission data (TD<1:M> of FIG. 2) during the read-modify-write operation. The ECC circuit 500 may correct errors of the first to $M^{th}$ transmission data (TD<1:M> of FIG. 2) to generate the first to $N^{th}$ write data (WDATA<1:N> of FIG. 2) during the write operation. The ECC circuit 500 may correct errors of the first to $N^{th}$ read data (RDATA<1:N> of FIG. 2) to output the corrected data as the first to $M^{th}$ transmission data (TD<1:M> of FIG. 2) during the read operation.

FIG. 2 is a block diagram illustrating a configuration of the semiconductor device 20. As illustrated in FIG. 2, the semiconductor device 20 may include a buffer circuit 100, the buffer control circuit 200, the operation control circuit 300, the core circuit 400, and the ECC circuit 500.

The buffer circuit 100 may include the first buffer 110, the second buffer 120, a third buffer 130, a fourth buffer 140, and a fifth buffer 150.

The first buffer 110 may be activated by the enable signal EN. The first buffer 110 may buffer the chip selection signal CS to generate the first internal chip selection signal ICS<1>. The first buffer 110 may be configured to include a CMOS buffer that is activated when the enable signal EN is enabled. The first buffer 110 may be activated during the self-refresh operation.

The second buffer 120 may be activated by the enable signal EN. The second buffer 120 may buffer the chip selection signal CS to generate a second internal chip selection signal ICS<2>. The second buffer 120 may be configured to include a differential amplification buffer that is activated when the enable signal EN is disabled. The second buffer 120 may be activated during the mode register write operation, the read-modify-write operation, the write operation, and the read operation.

The third buffer 130 may buffer the first to $K^{th}$ command/address signals CA<1:K> to generate the first to $K^{th}$ internal command/address signals ICA<1:K>, The third buffer 130 may be configured to include a differential amplification buffer. The third buffer 130 may be activated during the mode register write operation, the read-modify-write operation, the write operation, and the read operation.

The fourth buffer 140 may buffer the clock signal CLK to generate the internal clock signal ICLK. The fourth buffer 140 may be configured to include a differential amplification buffer. The fourth buffer 140 may be activated during the mode register write operation, the read-modify-write operation, the write operation, and the read operation.

The fifth buffer 150 may buffer the first to $M^{th}$ data DATA<1:M> to generate the first to $M^{th}$ transmission data TD<1:M> during the read-modify-write operation. The fifth buffer 150 may buffer the first to $M^{th}$ data DATA<1:M> to generate the first to $M^{th}$ transmission data TD<1:M> during the write operation. The fifth buffer 150 may buffer the first to $M^{th}$ transmission data TD<1:M> to generate the first to $M^{th}$ data DATA<1:M> during the read operation. The fifth buffer 150 may be configured to include a differential amplification buffer. The fifth buffer 150 may be activated during the read-modify-write operation, the write operation, and the read operation.

Although FIG. 2 illustrates an example in which the buffer circuit 100 includes five buffers, the number of buffers included in the buffer circuit 100 may be set to be different according the embodiments.

The buffer control circuit 200 may generate the enable signal EN for activating any one of the first buffer 110 and the second buffer 120 based on a reset signal RSTB and the self-refresh signal ISR during the self-refresh operation. The buffer control circuit 200 may generate the end control signal SRX and the supply control signal SR_APY from the first internal chip selection signal ICS<1> inputted through the first buffer 110.

The operation control circuit 300 may include a command decoder 310, a refresh control circuit 320, and an internal command generation circuit 330.

The command decoder 310 may be synchronized with the internal clock signal ICLK to generate a mode register write command MRW, a self-refresh command SREF, and a write command WT, one of which is selectively enabled according to a combination of the first to $K^{th}$ internal command/address signals ICA<1:K> when the second internal chip selection signal ICS<2> is enabled. The command decoder 310 may be synchronized with the internal clock signal ICLK to generate the mode register write command MRW which is enabled when the second internal chip selection signal ICS<2> is enabled and the first to $K^{th}$ internal command/address signals ICA<1:K> has a first logic level combination. The command decoder 310 may be synchronized with the internal clock signal ICLK to generate the self-refresh command SREF which is enabled when the second internal chip selection signal ICS<2> is enabled and the first to $K^{th}$ internal command/address signals ICA<1:K> has a second logic level combination. The command decoder 310 may be synchronized with the internal clock signal ICLK to generate the write command WT which is enabled when the second internal chip selection signal ICS<2> is enabled and the first to $K^{th}$ internal command/address signals ICA<1:K> has a third logic level combination. The first logic level combination of the first to $K^{th}$ internal command/address signals ICA<1:K> may be set as a logic level combination for the mode register write operation. The second logic level combination of the first to $K^{th}$ internal command/address signals ICA<1:K> may be set as a logic level combination for the self-refresh operation. The third logic level combination of the first to $K^{th}$ internal command/address signals ICA<1:K> may be set as a logic level combination for the read-modify-write operation. The first logic level combination, the second logic level combination, and the third logic level combination may be set to different from each other and may be set to be different according to the embodiments.

The refresh control circuit 320 may latch first to third pre-frequency information signals (FQ_PRE<1:3> of FIG. 8) inputted through the first to $K^{th}$ internal command/address signals ICA<1:K> when the mode register write command MRW is enabled. The refresh control circuit 320 may output the first to third pre-frequency information signals (FQ_PRE<1:3> of FIG. 8) as the first to third frequency information signals FQ_INF<1:3> if the update signal ICA<K> is inputted when the self-refresh command SREF is enabled. The refresh control circuit 320 may generate the self-refresh signal ISR that is enabled at a point in time when the self-refresh command SREF is enabled and is disabled at a point in time when the end control signal SRX is enabled. The update signal ICA<K> may be set as a signal inputted through the $K^{th}$ command/address signal CA<K>. The update signal ICA<K> may be set as a signal inputted through any one of the first to $K^{th}$ command/address signals CA<1:K> according to the embodiments.

The internal command generation circuit 330 may be synchronized with the internal clock signal ICLK to set the shift amount based on the first to third frequency information signals FQ_INF<1:3>. The internal command generation circuit 330 may be synchronized with the internal clock signal ICLK to generate the internal write command IWT by shifting the write command WT by the shift amount set by the first to third frequency information signals FQ_INF<1:3> after the internal read command IRD is generated.

The operation control circuit 300 may generate the first to third frequency information signals FQ_INF<1:3> from the first to $K^{th}$ internal command/address signals ICA<1:K> when the update signal ICA<K> is inputted during the mode register write operation. The operation control circuit 300 may adjust the shift amount based on the first to third frequency information signals FQ_INF<1:3> when the supply control signal SR_APY is inputted during the self-refresh operation. The operation control circuit 300 may generate the self-refresh signal ISR that is enabled based on the self-refresh command SREF and the end control signal SRX during the self-refresh operation. The operation control circuit 300 may generate the internal write command IWT by shifting the write command WT by the adjusted shift amount during the read-modify-write operation in synchronization with the internal clock signal ICLK after generating the internal read command IRD.

The core circuit 400 may output the first to $N^{th}$ read data RDATA<1:N> stored in the core circuit 400 based on the internal read command IRD during the read-modify-write operation, and then store the first to $N^{th}$ write data WDATA<1:N> based on the internal write command IWT. The core circuit 400 may output the first to $N^{th}$ read data RDATA<1:N> stored in the core circuit 400 based on the internal read command IRD during the read operation. The core circuit 400 may store the first to $N^{th}$ write data WDATA<1:N> based on the internal write command IWT during the write operation. The core circuit 400 may perform the self-refresh operation based on the self-refresh signal ISR.

The ECC circuit 500 may generate the first to $N^{th}$ write data WDATA<1:N> from the first to $N^{th}$ read data RDATA<1:N> and the first to $M^{th}$ transmission data TD<1:M> during the read-modify-write operation. The ECC circuit 500 may generate the first to $N^{th}$ write data WDATA<1:N> by calculating bit signals included in the first to $N^{th}$ read data RDATA<1:N> and bit signals included in the first to $M^{th}$ transmission data TD<1:M> during the read-modify-write operation. The ECC circuit 500 may generate the first to $N^{th}$ write data WDATA<1:N> by correcting errors of the first to $M^{th}$ transmission data TD<1:M> during the write operation. The ECC circuit 500 may output the first to $M^{th}$ transmission data TD<1:M> by correcting errors of the first to $N^{th}$ read data RDATA<1:N> during the read operation. The ECC circuit 500 may be realized using a general ECC circuit that corrects an error according to the calculation results of the bit signals of the first to $M^{th}$ transmission data TD<1:M>, the first to $N^{th}$ read data RDATA<1:N>, and the first to $N^{th}$ write data WDATA<1:N> using an error correction code (ECC).

The number "M" of bits of the first to $M^{th}$ transmission data TD<1:M> and the number "N" of bits of the first to $N^{th}$ read data RDATA<1:N> and the first to $N^{th}$ write data WDATA<1:N> may be set as natural numbers. In addition, the number "M" of bits and the number "N" of bits may be set to be equal to each other or to be different from each other according to the embodiments.

Logic levels of the first to third frequency information signals FQ_INF<1:3> for performing the frequency adjustment operation according to frequency periods will be described hereinafter in detail with reference to FIG. 3.

Prior to description, the frequency period means a period indicating a frequency range of the clock signal CLK per unit time.

When the frequency of the clock signal CLK is in a low frequency period "LOW," the first frequency information signal FQ_INF<1> may be generated to have a logic "high (H)" level, the second frequency information signal FQ_INF<2> may be generated to have a logic "low (L)" level, and the third frequency information signal FQ_INF<3> may be generated to have a logic "low (L)" level. At this time, a frequency period of the clock signal CLK may correspond to a period of 2000 Mbps to 4000 Mbps.

When the frequency of the clock signal CLK is in a middle frequency period "MIDDLE," the first frequency information signal FQ_INF<1> may be generated to have a logic "low (L)" level, the second frequency information signal FQ_INF<2> may be generated to have a logic "high (H)" level, and the third frequency information signal FQ_INF<3> may be generated to have a logic "low (L)" level. At this time, the frequency period of the clock signal CLK may correspond to a period of 4000 Mbps to 5200 Mbps.

When the frequency of the clock signal CLK is in a high period "HIGH," the first frequency information signal FQ_INF<1> may be generated to have a logic "low (L)" level, the second frequency information signal FQ_INF<2> may be generated to have a logic "low (L)" level, and the third frequency information signal FQ_INF<3> may be generated to have a logic "high (H)" level. At this time, the frequency period of the clock signal CLK may correspond to a period of 5200 Mbps to 6400 Mbps.

Figure 4:
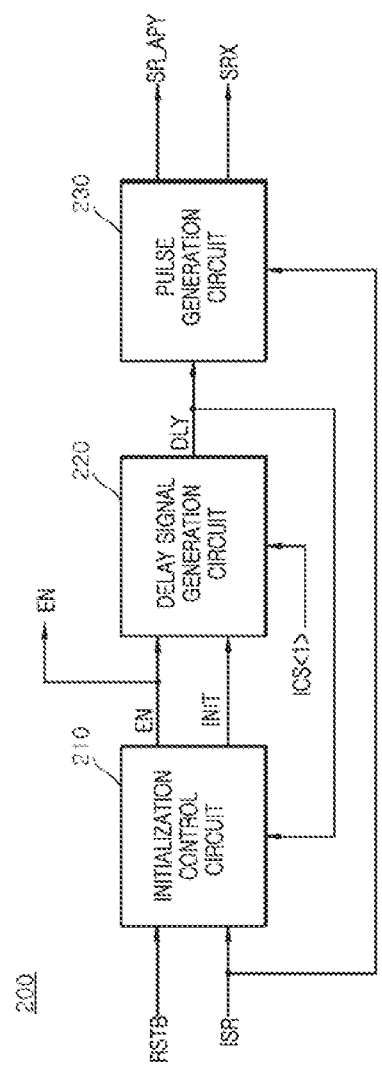
FIG. 4 is a block diagram illustrating a configuration of a buffer control circuit included in the semiconductor device illustrated in FIG. 2.

FIG. 4 is a block diagram illustrating a configuration of the buffer control circuit 200. As illustrated in FIG. 4, the buffer control circuit 200 may include an initialization control circuit 210, a delay signal generation circuit 220, and a pulse generation circuit 230.

The initialization control circuit 210 may generate an initialization signal INIT and the enable signal EN that are enabled during the self-refresh operation period. The initialization control circuit 210 may generate the initialization signal INIT and the enable signal EN that are enabled by the self-refresh signal ISR and the reset signal RSTB. The initialization control circuit 210 may generate the initialization signal INIT and the enable signal EN that are disabled by a delay signal DLY.

The delay signal generation circuit 220 may generate the delay signal DLY that is enabled at a point in time when the first internal chip selection signal ICS<1> is enabled. The delay signal generation circuit 220 may generate the delay signal DLY that is enabled based on the initialization signal NIT and the enable signal EN.

The pulse generation circuit 230 may generate the supply control signal SR_APY including a pulse created by the delay signal DIY while the self-refresh signal ISR is enabled and may generate the end control signal SRX. The pulse generation circuit 230 may generate the supply control signal SR_APY including a pulse created during the self-refresh operation period. The pulse generation circuit 230 may generate the end control signal SRX including a pulse created after the self-refresh operation period.

Figure 5:
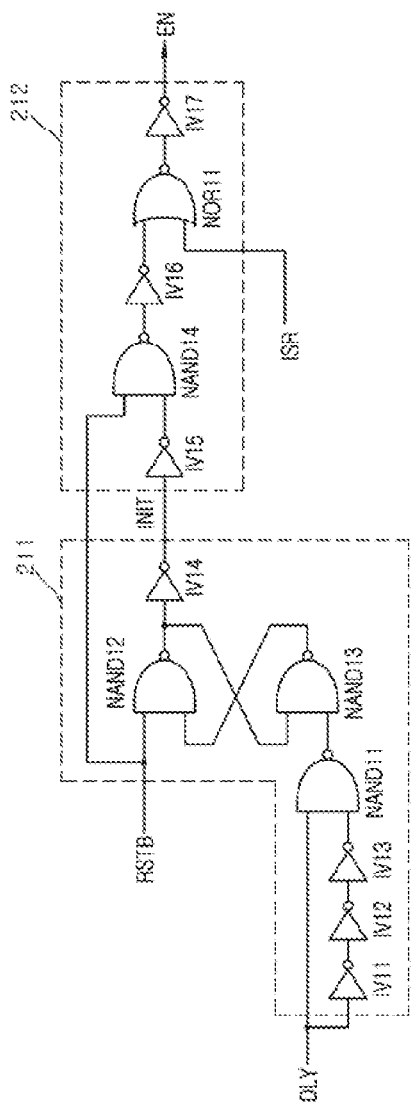
FIG. 5 is a circuit diagram illustrating a configuration of an initialization control circuit included in the buffer control circuit illustrated in FIG. 4.

FIG. 5 is a circuit diagram illustrating a configuration of the initialization control circuit 210. As illustrated in FIG. 5, the initialization control circuit 210 may include an initialization signal generation circuit 211 and an enable signal generation circuit 212.

The initialization signal generation circuit 211 may be realized using inverters IV11, IV12, IV13, and IV14 and NAND gates NAND11, NAND12, and NAND13. The initialization signal generation circuit 211 may generate the initialization signal INIT that is enabled to have a logic "low" level when the reset signal RSTB having a logic "low" level is inputted. The initialization signal generation circuit 211 may generate the initialization signal INIT that is disabled to have a logic "high" level when the delay signal DLY having a logic "high" level is input. The reset signal RSTB may be set to include a pulse having a logic "low" level during an initialization operation that the semiconductor system 1 starts to operate.

The enable signal generation circuit 212 may be realized using inverters IV15, IV16, and IV17, a NAND gate NAND14, and a NOR gate NOR11. The enable signal generation circuit 212 may generate the enable signal EN that is enabled to have a logic "high" level when the reset signal RSTB having a logic "high" level is inputted and the initialization signal INIT having a logic "low" level is inputted. The enable signal generation circuit 212 may generate the enable signal EN that is enabled to have a logic "high" level when the self-refresh signal ISR having a logic "high" level is inputted. The enable signal generation circuit 212 may generate the enable signal EN that is disabled to have a logic "low" level when the self-refresh signal ISR having a logic "low" level is inputted.

Figure 6:
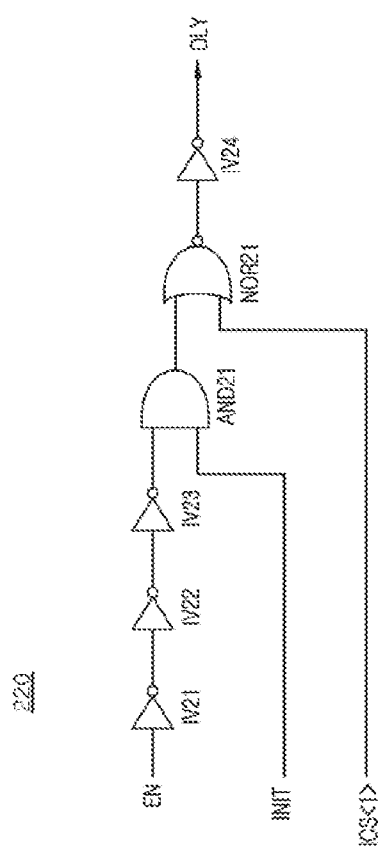
FIG. 6 is a circuit diagram illustrating a configuration of a delay signal generation circuit included in the buffer control circuit illustrated in FIG. 4.

FIG. 6 is a circuit diagram illustrating a configuration of the delay signal generation circuit 220. As illustrated in FIG. 6, the delay signal generation circuit 220 may include inverters IV21, IV22, IV23, and IV24, an AND gate AND21, and a NOR gate NOR21.

The delay signal generation circuit 220 may generate the delay signal DLY that is enabled to have a logic "high" level when the enable signal EN having a logic "low" level is inputted and the initialization signal INIT having a logic "high" level is inputted. The delay signal generation circuit 220 may generate the delay signal DLY that is enabled to have a logic "high" level when the first internal chip selection signal ICS<1> having a logic "high" level is inputted.

Figure 7:
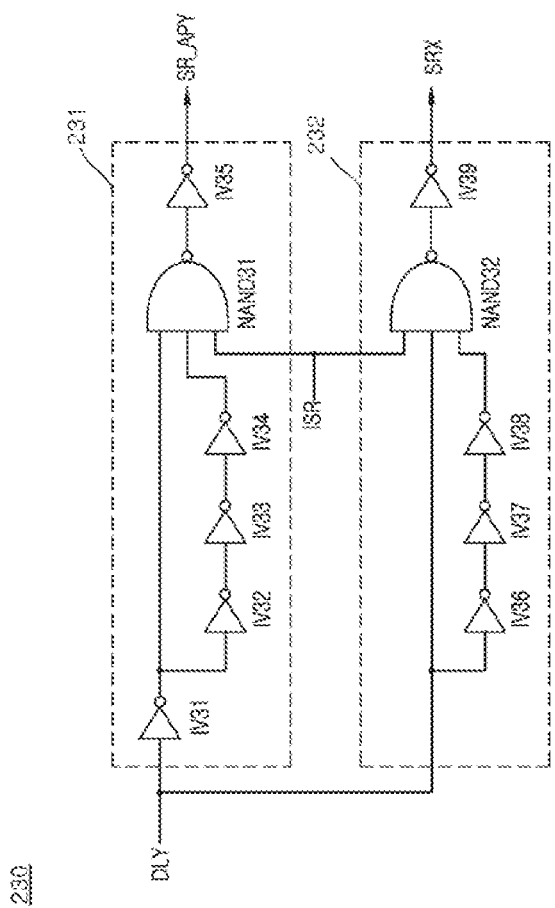
FIG. 7 is a circuit diagram illustrating a configuration of a pulse generation circuit included in the buffer control circuit illustrated in FIG. 4.

FIG. 7 is a circuit diagram illustrating a configuration of the pulse generation circuit 230. As illustrated in FIG. 7, the pulse generation circuit 230 may include a first pulse generation circuit 231 and a second pulse generation circuit 232.

The first pulse generation circuit 231 may be realized using inverters IV31, IV32, IV33, IV34, and IV35 and a NAND gate NAND31. The first pulse generation circuit 231 may generate the supply control signal SR_APY including a pulse that is generated when the delay signal DLY is disabled to have a logic "low" level. The first pulse generation circuit 231 may generate the supply control signal SR_APY including a pulse having a logic "high" level that is generated during a predetermined period when the delay signal DLY is disabled to have a logic "low" level.

The second pulse generation circuit 232 may be realized using inverters IV36, IV37, IV38, and IV39 and a NAND gate NAND32. The second pulse generation circuit 232 may generate the end control signal SRX including a pulse generated when the delay signal DLY is enabled to have a logic "high" level. The second pulse generation circuit 232 may generate the end control signal SRX including a pulse having a logic "high" level that is generated during a predetermined period when the delay signal DLY is enabled to have a logic "high" level.

Figure 8:
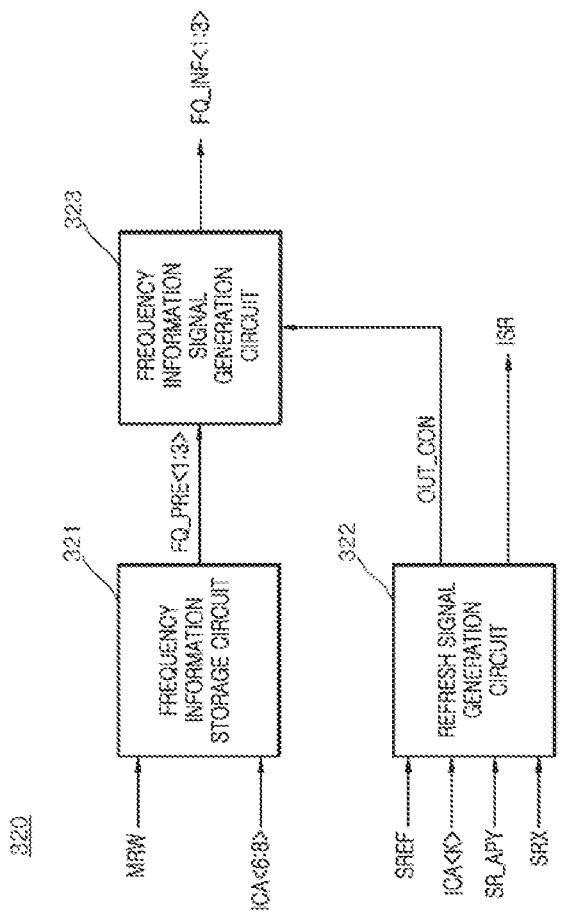
FIG. 8 is a block diagram illustrating a configuration of a refresh control circuit included in the semiconductor device illustrated in FIG. 2.

FIG. 8 is a circuit diagram illustrating a configuration of the refresh control circuit 320. As illustrated in FIG. 8, the refresh control circuit 320 may include a frequency information storage circuit 321, a refresh signal generation circuit 322, and a frequency information signal generation circuit 323.

The frequency information storage circuit 321 may latch the sixth to eighth internal command/address signals ICA<6:8> to generate the first to third pre-frequency information signals FQ_PRE<1:3> during the mode register write operation. The frequency information storage circuit 321 may latch the sixth to eighth internal command/address signals ICA<6:8> when the mode register write command MRW is enabled. The frequency information storage circuit 321 may output the latched signals of the sixth to eighth internal command/address signals ICA<6:8> when the mode register write command MRW is enabled. The frequency information storage circuit 321 may be realized to include a plurality of registers. Although FIG. 8 illustrates an example in which the frequency information storage circuit 321 is realized to latch the sixth to eighth internal command/address signals ICA<6:8> of three bits, the number of bits included in the internal command/address signals latched by the frequency information storage circuit 321 and the number of bits included in the pre-frequency information signals outputted from the frequency information storage circuit 321 may be set to be different according to the embodiments.

The refresh signal generation circuit 322 may generate an output control signal OUT_CON that is enabled at a point in time when the update signal ICA<K> is inputted during the self-refresh operation. The refresh signal generation circuit 322 may generate the output control signal OUT_CON that is enabled at a point in time when the update signal ICA<K> is inputted when the self-refresh command SREF and the supply control signal SR_APY are inputted. The refresh signal generation circuit 322 may generate the self-refresh signal ISR that is enabled during the self-refresh operation period. The refresh signal generation circuit 322 may generate the self-refresh signal ISR that is enabled at a point in time when the self-refresh command SREF is inputted and that is disabled at a point in time when the end control signal SRX is inputted.

The frequency information signal generation circuit 323 may generate the first to third frequency information signals FQ_INF<1:3> from the first to third pre-frequency information signals FQ_PRE<1:3> at a point in time when the output control signal OUT_CON is inputted.

Figure 9:
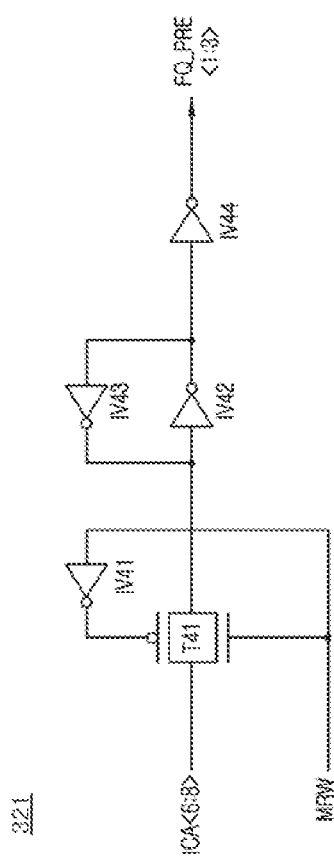
FIG. 9 is a circuit diagram illustrating a configuration of a frequency information storage circuit included in the refresh control circuit illustrated in FIG. 8.

FIG. 9 is a circuit diagram illustrating a configuration of the frequency information storage circuit 321. As illustrated in FIG. 9, the frequency information storage circuit 321 may be realized using a transfer gate T41 and inverters IV41, IV42, IV43, and IV44.

The frequency information storage circuit 321 may receive the sixth to eighth internal command/address signals ICA<6:8> when the mode register write command MRW is enabled to have a logic "high" level. The frequency information storage circuit 321 may receive and latch the sixth to eighth internal command/address signals ICA<6:8> when the mode register write command MRW is enabled to have a logic "high" level. The frequency information storage circuit 321 may generate the first to third pre-frequency information signals FQ_PRE<1:3> by buffering the latched signals of the sixth to eighth internal command/address signals ICA<6:8>.

Figure 10:
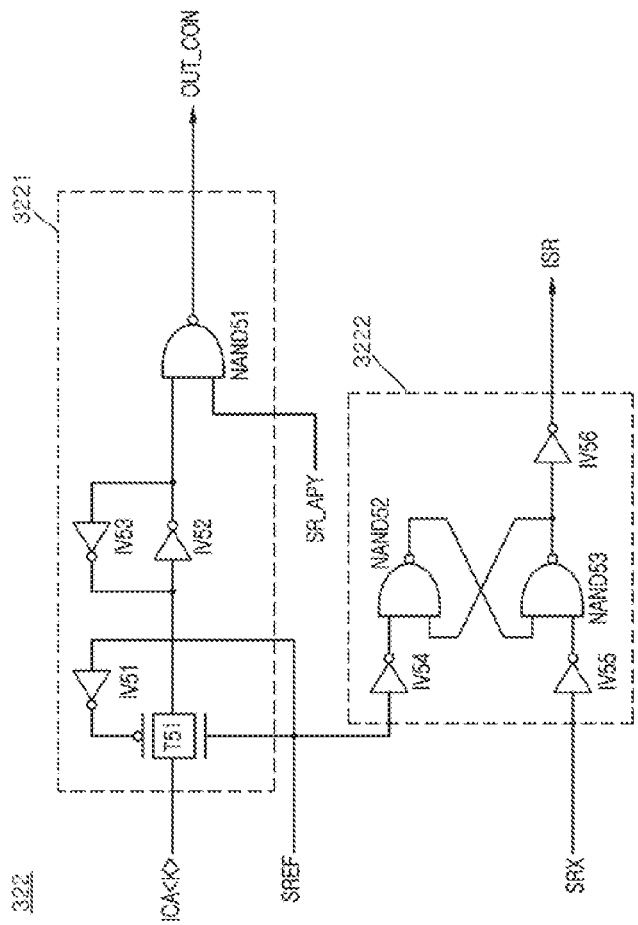
FIG. 10 is a circuit diagram illustrating a configuration of a refresh signal generation circuit included in the refresh control circuit illustrated in FIG. 8.

FIG. 10 is a circuit diagram illustrating a configuration of the refresh signal generation circuit 322. As illustrated in FIG. 10, the refresh signal generation circuit 322 may include an output control signal generation circuit 3221 and a latch circuit 3222.

The output control signal generation circuit 3221 may be realized using a transfer gate T51, inverters IV51, IV52, and IV53, and a NAND gate NAND51.

The output control signal generation circuit 3221 may receive the update signal ICA<K> when the self-refresh command SREF is enabled to have a logic "high" level. The output control signal generation circuit 3221 may receive and latch the update signal ICA<K> when the self-refresh command SREF is enabled to have a logic "high" level. The output control signal generation circuit 3221 may generate the output control signal OUT_CON by buffering the latched signal of the update signal ICA<K> when the supply control signal SR_APY is enabled to have a logic "high" level.

The latch circuit 3222 may be realized using inverters IV54, IV55, and IV56 and NAND gates NAND52 and NAND53.

The latch circuit 3222 may generate the self-refresh signal ISR that is enabled to have a logic "high" level when the self-refresh command SREF having the logic "high" level is inputted. The latch circuit 3222 may generate the self-refresh signal ISR that is disabled to have a logic "low" level when the end control signal SRX having the logic "high" level is inputted.

Figure 11:
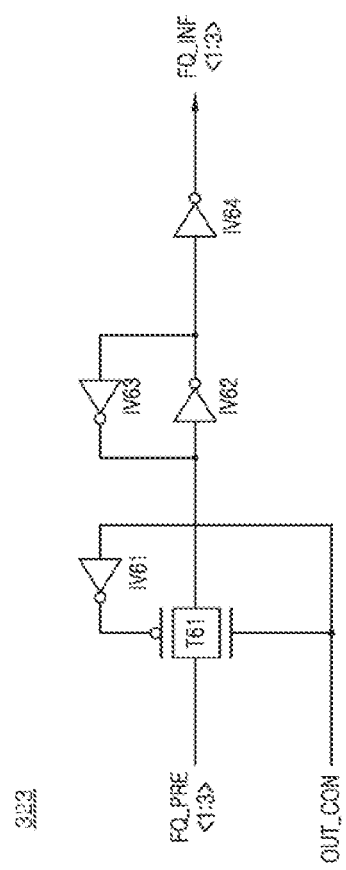
FIG. 11 is a circuit diagram illustrating a configuration of a frequency information signal generation circuit included in the refresh control circuit illustrated in FIG. 8.

FIG. 11 is a circuit diagram illustrating a configuration of the frequency information signal generation circuit 323. As illustrated in FIG. 11, the frequency information signal generation circuit 323 may be realized using a transfer gate T61 and inverters IV61, IV62, IV63, and IV64.

The frequency information signal generation circuit 323 may receive the first to third pre-frequency information signals FQ_PRE<1:3> when the output control signal OUT_CON is enabled to have a logic "high" level. The frequency information signal generation circuit 323 may receive and latch the first to third pre-frequency information signals FQ_PRE<1:3> when the output control signal OUT_CON is enabled to have a logic "high" level. The frequency information signal generation circuit 323 may generate the first to third frequency information signals FQ_INF<1:3> by buffering the latched signals of the first to third pre-frequency information signals FQ_PRE<1:3>. Although the frequency information signal generation circuit 323 is illustrated as one circuit, the frequency information signal generation circuit 323 may be configured to include three circuits corresponding to the number of bits included in the first to third frequency information signals FQ_INF<1:3>.

Figure 12:
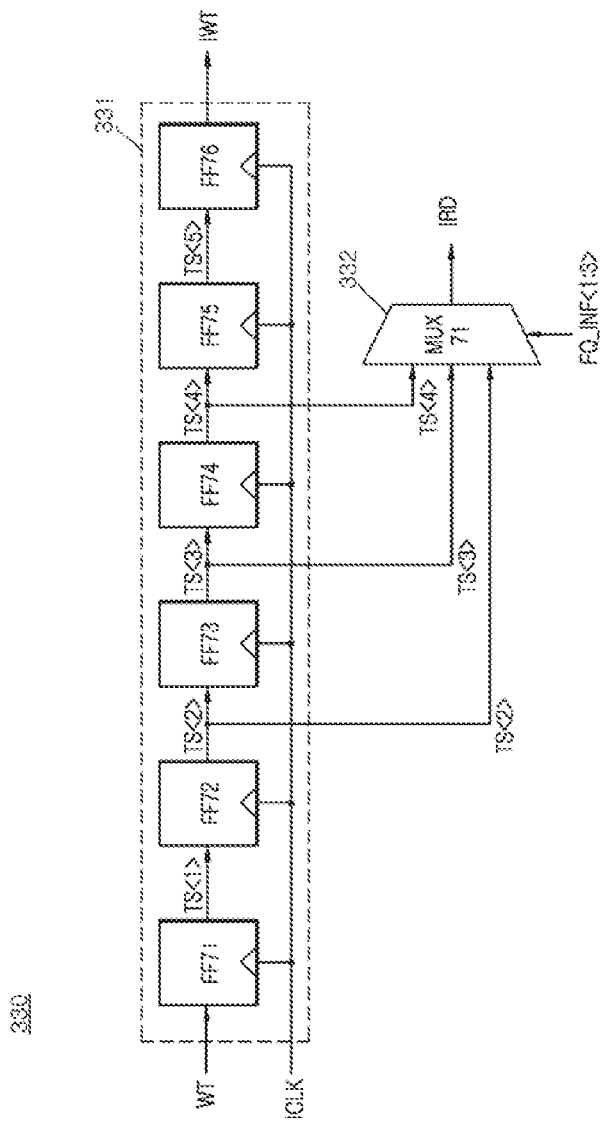
FIG. 12 illustrates a configuration of an internal command generation circuit included in the semiconductor device illustrated in FIG. 2.

FIG. 12 illustrates a configuration of then internal command generation circuit 330. As illustrated in FIG. 12, the internal command generation circuit 330 may include a shifting circuit 331 and a selection/transmission circuit 332.

The shifting circuit 331 may be realized using flip-flops FF71, FF72, FF73, FF74, FF75, and FF76. The flip-flop FF71 may generate a first transmission signal TS<1> by shifting the write command WT in synchronization with the internal clock signal ICLK. The flip-flop FF72 may generate a second transmission signal TS<2> by shifting the first transmission signal TS<1> in synchronization with the internal clock signal ICLK. The flip-flop FF73 may generate a third transmission signal TS<3> by shifting the second transmission signal TS<2> in synchronization with the internal clock signal ICLK. The flip-flop FF74 may generate a fourth transmission signal TS<4> by shifting the third transmission signal TS<3> in synchronization with the internal clock signal ICLK. The flip-flop FF75 may generate a fifth transmission signal TS<5> by shifting the fourth transmission signal TS<4> in synchronization with the internal clock signal ICLK. The flip-flop FF76 may generate the internal write command IWT by shifting the fifth transmission signal TS<5> in synchronization with the internal clock signal ICLK. Each of the flip-flops FF71, FF72, FF73, FF74, FF75, and FF76 may shift an input signal by one cycle of the internal clock signal ICLK to generate and output the shifted signal as an output signal.

The shifting circuit 331 may generate the internal write command IWT by shifting the write command WT by six cycles of the internal clock signal ICLK. Although the shifting circuit 331 includes six flip-flops to shift the write command WT by six cycles of the internal clock signal ICLK, the number of the flip-flops included in the shifting circuit may be set to be different according to the embodiments to appropriately adjust the shift amount for shifting the write command WT.

The selection/transmission circuit 332 may be realized using a multiplexer MUX71. When the first frequency information signal FQ_INF<1> is enabled to have a logic "high" level, the selection/transmission circuit 332 may output the fourth transmission signal TS<4> as the internal read command IRD. When the second frequency information signal FQ_INF<2> is enabled to have a logic "high" level, the selection/transmission circuit 332 may output the third transmission signal TS<3> as then internal read command IRD. When the third frequency information signal FQ_INF<3> is enabled to have a logic "high" level, the selection/transmission circuit 332 may output the second transmission signal TS<2> as the internal read command IRD.

The selection/transmission circuit 332 may output any one of the second to fourth transmission signals TS<2:4> as the internal read command IR© based on the first to third frequency information signals FQ_INF<1:3>. When the first frequency information signal FQ_INF<1> is enabled, the selection/transmission circuit 332 may generate the internal read command IRD from the fourth transmission signal TS<4> obtained by shifting the write command WT by four cycles of the internal clock signal ICLK. When the second frequency information signal FQ_INF<2> is enabled, the selection/transmission circuit 332 may generate the internal read command IRD from the third transmission signal TS<3> obtained by shifting the write command WT by three cycles of the internal clock signal ICLK. When the third frequency information signal FQ_INF<3> is enabled, the selection/transmission circuit 332 may generate the internal read command IRD from the second transmission signal TS<2> obtained by shifting the write command WT by two cycles of the internal clock signal ICLK.

Figure 13:
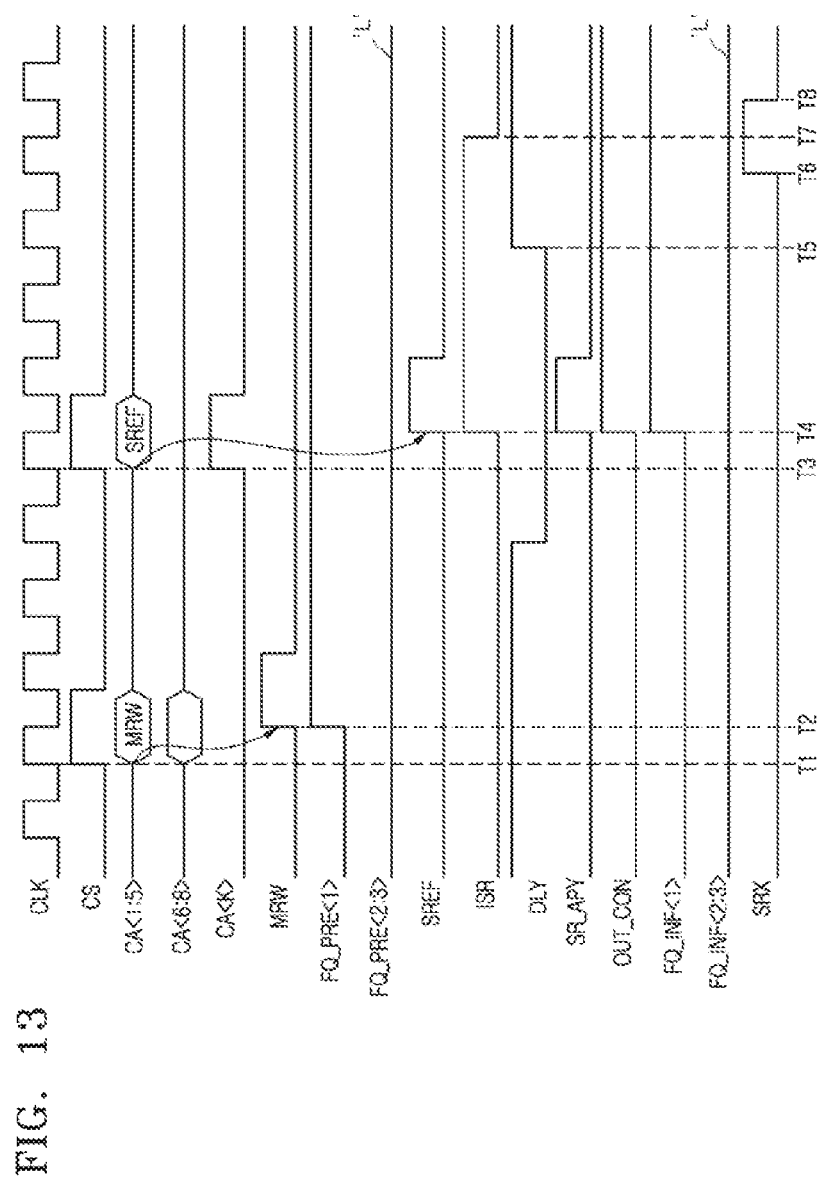
FIG. 13 is a timing diagram illustrating an operation of generating a frequency information signal for performing a frequency adjustment operation during a self-refresh operation of a semiconductor system according to an embodiment of the present disclosure.

The frequency adjustment operation of the semiconductor system according to an embodiment of the present disclosure during the mode register write operation and the self-refresh operation will be described hereinafter with reference to FIG. 13 in conjunction with a case that the frequency of the clock signal CLK is in the low frequency period "LOW."

At a point in time "T1," the controller 10 may transmit the clock signal CLK, the chip selection signal CS having a logic "high" level, the first to fifth command/address signals CA<1:5> having a first logic level combination, and the sixth to eighth command/address signals CA<6:8> to the semiconductor device 20. The first to fifth command/address signals CA<1:5> having a first logic level combination may be set to have logic levels for performing the mode register write operation. The sixth to eighth command/address signals CA<6:8> may be set to include frequency information for the frequency adjustment operation.

The second buffer 120 may buffer the chip selection signal CS to generate the second internal chip selection signal ICS<2>. At this time, the first buffer 110 may be inactivated.

The third buffer 130 may buffer the first to eighth command/address signals CA<1:8> to generate the first to eighth internal command/address signals ICA<1:8>.

The fourth buffer 140 may buffer the clock signal CLK to generate the internal clock signal ICLK.

At a point in time "T2/" the command decoder 310 may be synchronized with the internal clock signal ICLK to generates the mode register write command MRW that is enabled to have a logic "high" level based on the second internal chip selection signal ICS<2> having a logic "high" level and the first to fifth internal command/address signals ICA<1:5> having the first logic level combination.

The frequency information storage circuit 321 may receive the mode register write command MRW having a logic "high" level to generates the first pre-frequency information signal FQ_PRE<1> having a logic "high" level, the second pre-frequency information signal FQ_PRE<2> having a logic "low" level, and the third pre-frequency information signal FQ_PRE<3> having a logic "low" level from the sixth to eighth internal command/address signals ICA<6:8>.

At a point in time "T3," the controller 10 may transmit the clock signal CLK, the chip selection signal CS having a logic "high" level, the first to fifth command/address signals CA<1:5> having a second logic level combination, and the $K^{th}$ command/address signal CA<K> having a logic "high" level to the semiconductor device 20. The first to fifth command/address signals CA<1:5> having the second logic level combination may be set to have logic levels for performing the self-refresh operation. The $K^{th}$ command/address signal CA<K> may be set as the update signal.

The first buffer 110 may buffer the chip selection signal CS to generate the first internal chip selection signal ICS<1>. At this time, the second buffer 120 may be inactivated.

The third buffer 130 may buffer the first to fifth command/address signals CA<1:5> to generate the first to fifth internal command/address signals ICA<1:5> and may buffer the $K^{th}$ command/address signal CA<K> to generate the $K^{th}$ internal command/address signal ICA<K> having a logic "high" level.

The fourth buffer 140 may buffer the clock signal CLK to generate the internal clock signal ICLK.

At a point in time "T4," the command decoder 310 may be synchronized with the internal clock signal ICLK to generate the self-refresh command SREF that is enabled to have a logic "high" level based on the first internal chip selection signal ICS<1> having a logic high "level" level and the first to fifth internal command/address signals ICA<1:5> having the second logic level combination.

The refresh signal generation circuit 322 may generate the output control signal OUT_CON that is enabled to have a logic "high" level based on the update signal ICA<K> having a logic "high" level. The refresh signal generation circuit 322 may generate the self-refresh signal ISR enabled to have a logic "high" level based on the self-refresh command SREF having a logic "high" level.

The pulse generation circuit 230 may generate the supply control signal SR_APY having a logic "high" level based on the self-refresh signal ISR having a logic "high" level.

The refresh signal generation circuit 322 may generate the output control signal OUT_CON enabled to have a logic "high" level based on the self-refresh command SREF having a logic "high" level, the supply control signal SR_APY having a logic "high" level, and the $K^{th}$ internal command/address signal ICA<K> having a logic "high" level.

The frequency information signal generation circuit 323 may generate the first frequency information signal FQ_INF<1> having a logic "high" level from the first pre-frequency information signal FQ_PRE<1>, may generate the second frequency information signal FQ_INF<2> having a logic "low" level from the second pre-frequency information signal FQ_PRE<2>, and may generate the third frequency information signal FQ_INF<3> having a logic "low" level from the third pre-frequency information signal FQ_PRE<3>, based on the output control signal OUT_CON having a logic "high" level.

At a point in time "T5," the delay signal generation circuit 220 may generate the delay signal DLY enabled to have a logic "high" level based on the first internal chip selection signal ICS<1> having the logic "high" level that is generated at the point in time "T3."

At a point in time "T6," the pulse generation circuit 230 may generate the end control signal SRX having a logic "high" level based on the delay signal DLY generated to have a logic "high" level at the point in time "T5" and the self-refresh signal ISR having a logic "high" level.

At a point in time "T7," the refresh signal generation circuit 322 may generate the self-refresh signal ISR disabled to have a logic "low" level based on the end control signal SRX having a logic "high" level.

At a point in time "T8," the pulse generation circuit 230 may generate the end control signal SRX having a logic "low" level based on the self-refresh signal ISR having a logic "low" level.

As described above, a semiconductor device according to an embodiment may update information on a frequency period during a mode register write operation and may generate a frequency information signal for performing a frequency adjustment operation according to the frequency period during a self-refresh operation.

Figure 14:
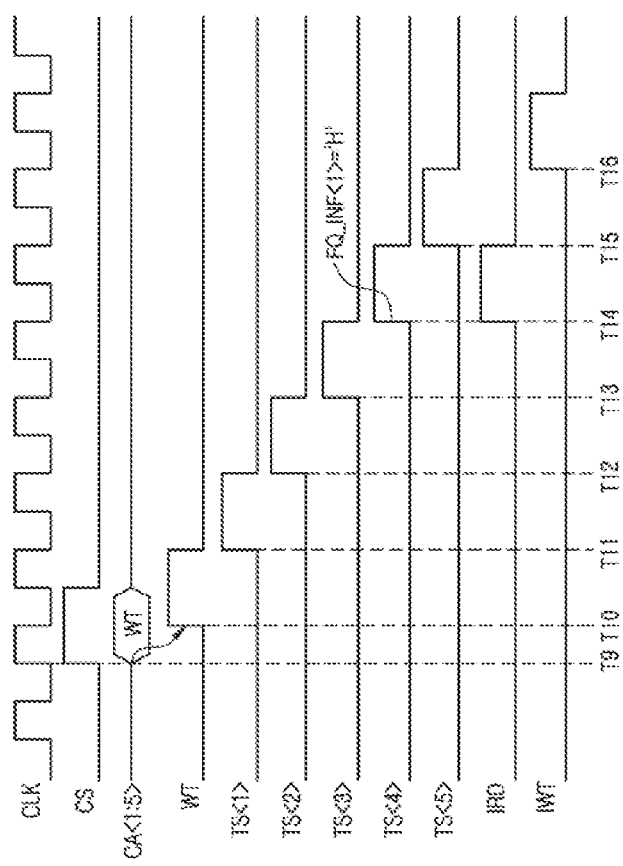
FIG. 14 is a timing diagram illustrating a frequency adjustment operation during a read-modify-write operation of a semiconductor system according to an embodiment of the present disclosure.

The read-modify-write operation of the semiconductor system according to an embodiment of the present disclosure will be described hereinafter with reference to FIG. 14 in conjunction with a case that the frequency of the clock signal CLK is in the low frequency period "LOW."

At a point in time "T9," the controller 10 may transmit the clock signal CLK, the chip selection signal CS having a logic "high" level, and the first to fifth command/address signals CA<1:5> having a third logic level combination to the semiconductor device 20. The controller 10 may transmit the data DATA<1:M> to the semiconductor device 20.

The first to fifth command/address signals CA<1:5> having the third logic level combination may be set to have logic levels for performing the read-modify-write operation.

The second buffer 120 may buffer the chip selection signal CS to generate the second internal chip selection signal ICS<2>. At this time, the first buffer 110 may be inactivated.

The third buffer 130 may buffer the first to fifth command/address signals CA<1:5> to generate the first to fifth internal command/address signals ICA<1:5>.

The fourth buffer 140 may buffer the clock signal CLK to generate the internal clock signal ICLK.

The fifth buffer 150 may buffer the data DATA<1:M> to generate the transmission data TD<1:M>.

At a point in time "T10," the command decoder 310 may be synchronized with the internal dock signal ICLK to generate the write command WT enabled to have a logic "high" level based on the second internal chip selection signal ICS<2> having a logic "high" level and the first to fifth internal command/address signals ICA<1:5> having the third logic level combination.

At a point in time "T11," the flip-flop FF71 of the shifting circuit 331 may be synchronized with the internal clock signal ICLK to generate the first transmission signal TS<1> by shifting the write command WT generated at the point in time "T10."

At a point in time "T12," the flip-flop FF72 of the shifting circuit 331 may be synchronized with the internal clock signal ICLK to generate the second transmission signal TS<2> by shifting the first transmission signal TS<1> generated at the point in time "T11,"

At a point in time "T13," the flip-flop FF73 of the shifting circuit 331 may be synchronized with the internal clock signal ICLK to generate the third transmission signal TS<3> by shifting the second transmission signal TS<2> generated at the point in time "T12."

At a point in time "T14," the flip-flop FF74 of the shifting circuit 331 may be synchronized with the internal clock signal ICLK to generate the fourth transmission signal TS<4> by shifting the third transmission signal TS<3> generated at the point in time "T13."

The selection/transmission circuit 332 may output the fourth transmission signal TS<4> as the internal read command IR© based on the first frequency information signal FQ_INF<1> having a logic "high" level.

The core circuit 400 may output the first to $N^{th}$ read data RDATA<1:N> based on the internal read command IRD.

The ECC circuit 500 may generate the first to $N^{th}$ write data WDATA<1:N> by calculating the first to $N^{th}$ read data RDATA<1:N> and the first to $M^{th}$ transmission data TD<1:M> generated at the point in time "T9."

At a point in time "T15," the flip-flop FF75 of the shifting circuit 331 may synchronized with the internal clock signal ICLK to generate the fifth transmission signal TS<5> by shifting the fourth transmission signal TS<4> generated at the point in time "T14."

At a point in time "T16," the flip-flop FF76 of the shifting circuit 331 may be synchronized with the internal clock signal ICLK to generate the internal write command IWT by shifting the fifth transmission signal TS<5> generated at the point in time "T15."

The core circuit 400 may store the first to $N^{th}$ write data WDATA<1:N> based on the internal write command IWT.

As described above, the semiconductor device according to an embodiment of the present disclosure may perform a stable read-modify-write operation despite a change of a frequency period by adjusting the shift amount for generating an internal read command during a read-modify-write operation based on frequency information updated during a write operation.

Figure 15:
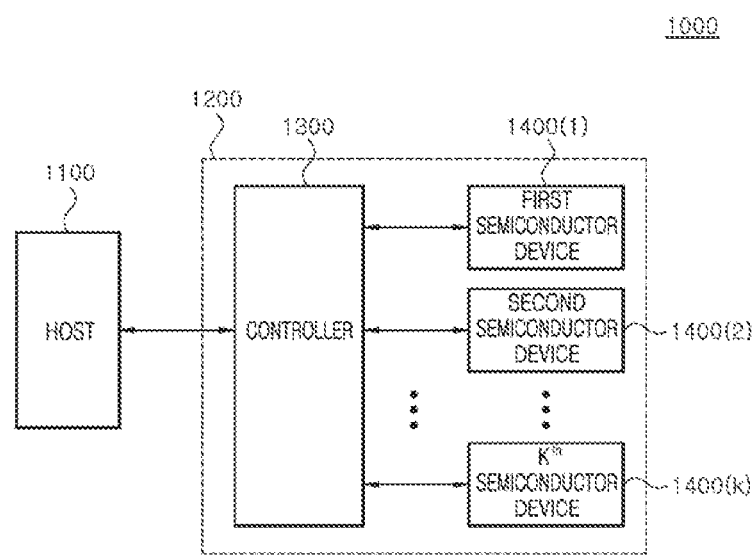
FIG. 15 is a block diagram illustrating a configuration of an electronic system according to an embodiment of the present disclosure.

FIG. 15 is a block diagram illustrating a configuration of an electronic system 1000 according to an embodiment of the present disclosure. As illustrated in FIG. 15, the electronic system 1000 may include a host 1100 and a semiconductor system 1200.

The host 1100 and the semiconductor system 1200 may transmit signals to each other using an interface protocol. The interface protocol used for communication between the host 1100 and the semiconductor system 1200 may include any one of various interface protocols such as a multi-media card (MMC), an enhanced small device interface (ESDI), an integrated drive electronics (IDE), a peripheral component interconnect-express (PCI-E), an advanced technology attachment (ATA), a serial ATA (SATA), a parallel ATA (DATA), a serial attached SCSI (SAS), and a universal serial bus (USB).

The semiconductor system 1200 may include a controller 1300 and semiconductor devices 1400(K:1). The controller 1300 may control the semiconductor devices 1400(K:1) such that the semiconductor devices 1400(K:1) perform the mode register write operation, the self-refresh operation, and the read-modify-write operation. Each of the semiconductor devices 1400(K:1) may receive information on a frequency according to a frequency period during the mode register write operation. Each of the semiconductor devices 1400(K:1) may update the frequency information during the self-refresh operation. Each of the semiconductor devices 1400(K:1) may adjust the shift amount for generating the internal read command IR© according to the updated frequency information during the read-modify-write operation and may perform the read-modify-write operation based on the internal read command IR© and the internal write command IWT. Thus, it may be possible to stably perform the read-modify-write operation despite a change of the frequency period.

The controller 1300 may be realized using the controller 10 illustrated in FIG. 1. Each of the semiconductor devices 1400(K:1) may be realized using the semiconductor device 20 illustrated in FIG. 1. In some embodiments, each of the semiconductor devices 1400(K:1) may be realized using any one of a dynamic random access memory (DRAM), a phase change random access memory (PRAM), a resistive random access memory (RRAM), a magnetic random access memory (MRAM), and a ferroelectric random access memory (FRAM).

What is claimed is:

1. A semiconductor device comprising:
   a buffer control circuit configured to generate an enable signal based on a self-refresh signal and configured to generate an end control signal and a supply control signal from a first internal chip selection signal during a self-refresh operation; and
   an operation control circuit configured to generate a frequency information signal from an internal command/address signal when an update signal is inputted during a mode register write operation, configured to adjust a shift amount based on the frequency information signal when the supply control signal is inputted during the mode register write operation, and configured to generate an internal write command according to the adjusted shift amount during a read-modify-write operation in synchronization with an internal clock signal after generating an internal read command.

2. The device of claim 1, wherein the operation control circuit configured to generate the frequency information signal when the update signal is inputted through a specific bit of a command/address signal.

3. The device of claim 1, wherein the buffer control circuit comprises:
   an initialization control circuit configured to generate an initialization signal and the enable signal which are enabled by the self-refresh signal and a reset signal;
   a delay signal generation circuit configured to generate a delay signal that is enabled at a point in time when the first internal chip selection signal is enabled or that is enabled based on the initialization signal and the enable signal; and
   a pulse generation circuit configured to generate the supply control signal including a pulse created by the delay signal while the self-refresh signal is enabled and configured to generate the end control signal.

4. The device of claim 3, wherein the initialization control circuit comprises:
   an initialization signal generation circuit configured to generate the initialization signal that is enabled when the reset signal is enabled and that is disabled when the delay signal is enabled; and
   an enable signal generation circuit configured to generate the enable signal that is enabled when the self-refresh signal is enabled or when the reset signal and the initialization signal are disabled.

5. The device of claim 3, wherein the pulse generation circuit comprises:
   a first pulse generation circuit configured to generate the supply control signal including a pulse created when the delay signal is disabled while the self-refresh signal is enabled; and
   a second pulse generation circuit configured to generate the end control signal including a pulse created when the delay signal is enabled while the self-refresh signal is enabled.

6. The device of claim 1, wherein the operation control circuit comprises:
   a command decoder configured to be synchronized with the internal clock signal to generate a mode register write command, a self-refresh command, and a write command, one of which is selectively enabled according to a logic level combination of the internal command/address signal when a second internal chip selection signal is enabled;
a refresh control circuit configured to latch a pre-frequency information signal inputted through the internal command/address signal when the mode register write command is enabled, configured to output the pre-frequency information signal as the frequency information signal when the update signal is inputted when the self-refresh command is enabled, and configured to generate the self-refresh signal that is enabled at a point in time when the self-refresh command is enabled and that is disabled at a point in time when the end control signal is enabled; and
an internal command generation circuit configured to generate the internal write command by shifting the write command by the shift amount set by the frequency information signal in synchronization with the internal clock signal after generating the internal read command.

7. The device of claim 6, wherein the refresh control circuit comprises:
a frequency information storage circuit configured to latch the internal command/address signal when the mode register write command is enabled and configured to output the latched internal command/address signal as the pre-frequency information signal;
a refresh signal generation circuit configured to generate an output control signal that is enabled at a point in time when the update signal is inputted when the self-refresh command and the supply control signal are inputted and configured to generate the self-refresh signal, an enablement period of which is set by the self-refresh command and the end control signal; and
a frequency information signal generation circuit configured to generate the frequency information signal from the pre-frequency information signal at a point in time when the output control signal is inputted.

8. The device of claim 7, wherein the refresh signal generation circuit comprises:
an output control signal generation circuit configured to receive and latch the update signal while the self-refresh command is enabled and configured to generate the output control signal from the latched update signal while the supply control signal is enabled; and
a latch circuit configured to generate the self-refresh signal that is enabled at a point in time when the self-refresh command is enabled and that is disabled at a point in time when the end control signal is enabled.

9. The device of claim 6, wherein the internal command generation circuit comprises:
a shifting circuit configured to generate first to third transmission signals by sequentially shifting the write command in synchronization with the internal clock signal and configured to generate the internal write command by shifting the third transmission signal; and
a selection/transmission circuit configured to output any one of the first to third transmission signals as the internal read command based on the frequency information signal.

10. The device of claim 1, further comprising:
a first buffer configured to be activated by the enable signal to generate the first internal chip selection signal by buffering a chip selection signal; and
a second buffer configured to be activated by the enable signal to generate a second internal chip selection signal by buffering the chip selection signal.

11. The device of claim 10,
wherein the first buffer comprises a CMOS buffer;
wherein the second buffer comprises a differential amplification buffer;
wherein the first buffer is configured to be activated during the self-refresh operation; and
wherein the second buffer is configured to be activated during the read-modify-write operation.

12. A semiconductor device comprising:
an operation control circuit configured to generate a frequency information signal for adjusting a shift amount from an internal command/address signal based on an update signal during a mode register write operation, configured to adjust the shift amount based on the frequency information signal, and configured to generate an internal write command in synchronization with an internal clock signal according to the adjusted shift amount during a read-modify-write operation after generating an internal read command;
a core circuit configured to output read data stored in the core circuit based on the internal read command and configured to store write data based on the internal write command; and
an error correction code (ECC) circuit configured to generate the write data from the read data and transmission data during the read-modify-write operation.

13. The device of claim 12, wherein the ECC circuit is configured to generate the write data by calculating bit signals included in the read data and bit signals of the transmission data during the read-modify-write operation.

14. The device of claim 12, wherein the ECC circuit is configured to generate the write data by correcting an error of the transmission data during a write operation and correct an error of the read data to output the corrected read data as the transmission data during a read operation.

15. The device of claim 12, wherein the update signal is inputted through a specific bit signal of a command/address signal.

16. The device of claim 12, wherein the operation control circuit comprises:
a command decoder configured to be synchronized with an internal clock signal to generate a mode register write command, a self-refresh command, and a write command, one of which is selectively enabled according to a logic level combination of the internal command/address signal when a second internal chip selection signal is enabled;
a refresh control circuit configured to latch a pre-frequency information signal inputted through the internal command/address signal when the mode register write command is enabled, configured to output the pre-frequency information signal as the frequency information signal when the update signal is inputted when the self-refresh command is enabled, and configured to generate the self-refresh signal that is enabled at a point in time when the self-refresh command is enabled and that is disabled at a point in time when the end control signal is enabled; and
an internal command generation circuit configured to generate the internal write command by shifting the write command by the shift amount set by the frequency information signal in synchronization with the internal clock signal after generating the internal read command.

17. The device of claim 16, wherein the refresh control circuit comprises:

a frequency information storage circuit configured to latch the internal command/address signal when the mode register write command is enabled and configured to output the latched internal command/address signal as the pre-frequency information signal;

a refresh signal generation circuit configured to generate an output control signal that is enabled at a point in time when the update signal is inputted when the self-refresh command and the supply control signal are inputted and configured to generate the self-refresh signal, an enablement period of which is set by the self-refresh command and the end control signal; and a frequency information signal generation circuit configured to generate the frequency information signal from the pre-frequency information signal at a point in time when the output control signal is inputted.

18. The device of claim 17, wherein the refresh signal generation circuit comprises:

an output control signal generation circuit configured to receive and latch the update signal while the self-refresh command is enabled and configured to generate the output control signal from the latched update signal while the supply control signal is enabled; and a latch circuit configured to generate the self-refresh signal that is enabled at a point in time when the self-refresh command is enabled and that is disabled at a point in time when the end control signal is enabled.

19. The device of claim 16, wherein the internal command generation circuit comprises:

a shifting circuit configured to generate first to third transmission signals by sequentially shifting the write command in synchronization with the internal clock signal and configured to generate the internal write command by shifting the third transmission signal; and a selection/transmission circuit configured to output any one of the first to third transmission signals as the internal read command based on the frequency information signal.

20. The device of claim 12, further comprising:
a buffer circuit including first to fifth buffers; and
a buffer control circuit configured to generate an enable signal for activating any one of the first and second buffers based on a self-refresh signal and configured to generate an end control signal and a supply control signal from a first internal chip selection signal inputted through the first buffer.

21. The device of claim 20,
wherein the first buffer is configured to be activated by the enable signal to generate the first internal chip selection signal by buffering a chip selection signal, and wherein the second buffer is configured to be activated by the enable signal to generate a second internal chip selection signal by buffering the chip selection signal.

22. The device of claim 20,
wherein the third buffer is configured to buffer a command/address signal to generate the internal command/address signal;

wherein the fourth buffer is configured to buffer a clock signal to generate the internal clock signal; and wherein the fifth buffer is configured to output external data as the transmission data or outputs the transmission data as the external data.

23. The device of claim 20, wherein the buffer control circuit comprises:

an initialization control circuit configured to generate an initialization signal and the enable signal which are enabled by the self-refresh signal and a reset signal;

a delay signal generation circuit configured to generate a delay signal that is enabled at a point in time when the first internal chip selection signal is enabled or that is enabled based on the initialization signal and the enable signal; and a pulse generation circuit configured to generate the supply control signal including a pulse created by the delay signal while the self-refresh signal is enabled and configured to generate the end control signal.

24. The device of claim 23, wherein the initialization control circuit comprises:

an initialization signal generation circuit configured to generate the initialization signal that is enabled when the reset signal is enabled and that is disabled when the delay signal is enabled; and an enable signal generation circuit configured to generate the enable signal that is enabled when the self-refresh signal is enabled or when the reset signal and the initialization signal are disabled.

25. The device of claim 23, wherein the pulse generation circuit comprises:

a first pulse generation circuit configured to generate the supply control signal including a pulse created when the delay signal is disabled while the self-refresh signal is enabled; and a second pulse generation circuit configured to generate the end control signal including a pulse created when the delay signal is enabled while the self-refresh signal is enabled.

* * * * *